(12) United States Patent
Li et al.

(10) Patent No.: US 11,647,661 B2
(45) Date of Patent: May 9, 2023

(54) DISPLAY SUBSTRATE AND MANUFACTURING METHOD THEREOF, DISPLAY DEVICE

(71) Applicant: Beijing BOE Technology Development Co., Ltd., Beijing (CN)

(72) Inventors: Yunlong Li, Beijing (CN); Pengcheng Lu, Beijing (CN); Kui Zhang, Beijing (CN); Li Liu, Beijing (CN); Shengji Yang, Beijing (CN); Kuanta Huang, Beijing (CN); Xiaochuan Chen, Beijing (CN); Dacheng Zhang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 193 days.

(21) Appl. No.: 16/959,043

(22) PCT Filed: Aug. 27, 2019

(86) PCT No.: PCT/CN2019/102848
§ 371 (c)(1),
(2) Date: Jun. 29, 2020

(87) PCT Pub. No.: WO2021/035534
PCT Pub. Date: Mar. 4, 2021

(65) Prior Publication Data
US 2021/0408134 A1    Dec. 30, 2021

(51) Int. Cl.
*H01L 27/32* (2006.01)
*H01L 51/00* (2006.01)
(Continued)

(52) U.S. Cl.
CPC ........ *H01L 27/322* (2013.01); *H01L 27/3225* (2013.01); *H01L 27/3244* (2013.01);
(Continued)

(58) Field of Classification Search
None
See application file for complete search history.

(56) References Cited

U.S. PATENT DOCUMENTS

| | | |
|---|---|---|
| 2014/0117334 A1 | 5/2014 | Nakamura et al. |
| 2017/0005144 A1 | 1/2017 | Akagawa et al. |
| (Continued) | | |

FOREIGN PATENT DOCUMENTS

| | | |
|---|---|---|
| CN | 104090428 A | 10/2014 |
| CN | 105093626 A | 11/2015 |
| (Continued) | | |

OTHER PUBLICATIONS

Sep. 9, 2022—(EP) Extended European Search Report 19933234.7.

*Primary Examiner* — J. E. Schoenholtz
(74) *Attorney, Agent, or Firm* — Banner & Witcoff, Ltd.

(57) ABSTRACT

A display substrate and a manufacturing method thereof, and a display device. The display substrate includes: a base substrate including a display region and a peripheral region surrounding the display region; a first light emitting element in the display region of the base substrate; and a color film structure on a display side of the first light emitting element. The color film structure includes: a first color film, including only a first pixel color film located in the display region; and a second color film, including a second pixel color film located in the display region and at least partially non-overlapping with the first pixel color film, and a first frame color film located in the peripheral region and surrounding the display region.

19 Claims, 8 Drawing Sheets

(51) Int. Cl.
*H01L 51/52* (2006.01)
*H01L 51/56* (2006.01)
*G09G 3/3225* (2016.01)

(52) U.S. Cl.
CPC ...... *H01L 51/0096* (2013.01); *H01L 51/5253* (2013.01); *H01L 51/56* (2013.01); *G09G 3/3225* (2013.01); *G09G 2300/0426* (2013.01); *G09G 2300/0819* (2013.01); *G09G 2320/0257* (2013.01); *H01L 2227/323* (2013.01)

(56) References Cited

U.S. PATENT DOCUMENTS

| | | |
|---|---|---|
| 2017/0236879 A1* | 8/2017 | Kubota ................ G02B 27/017 257/40 |
| 2018/0277610 A1 | 9/2018 | Kubota et al. |
| 2019/0129242 A1 | 5/2019 | Park et al. |
| 2019/0273122 A1* | 9/2019 | Iwasaki ................ H01L 51/524 |
| 2020/0295091 A1* | 9/2020 | Iwasaki .................. H01L 51/56 |

FOREIGN PATENT DOCUMENTS

| | | |
|---|---|---|
| CN | 107272252 A | 10/2017 |
| CN | 108878687 A | 11/2018 |
| JP | 2016138967 A | 8/2016 |
| KR | 100362436 B1 | 11/2001 |

\* cited by examiner

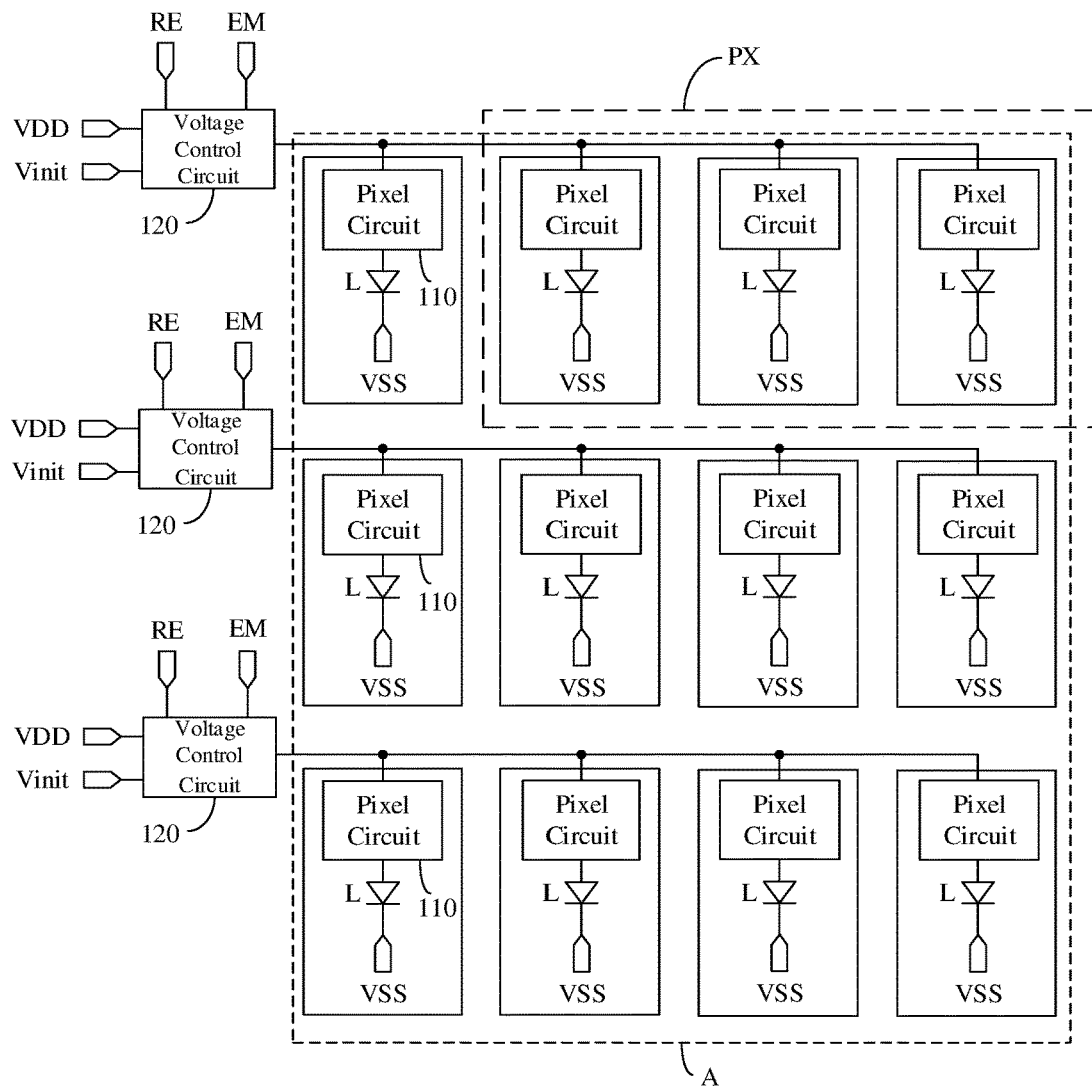

FIG. 7

| forming a first color film on a transparent bottom layer, in which the transparent bottom layer includes a display region and a peripheral region surrounding the display region, and the first color film includes only a first pixel color film located in the display region | ⟶ S11 |

↓

| forming a second color film on the first color film, in which the second color film includes: a second pixel color film located in the display region and at least partially non-overlapping with the first pixel color film, and a first frame color film located in the peripheral region and surrounding the display region. | ⟶ S12 |

FIG. 8A

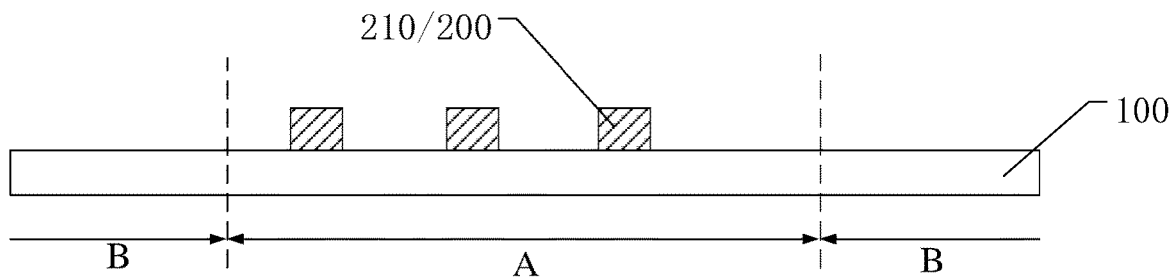

FIG. 8B

| forming the first color film on the transparent bottom layer, in which the transparent bottom layer includes the display region and the peripheral region surrounding the display region, and the first color film includes only the first pixel color film located in the display region | S11 |

↓

| forming the second color film on the first color film, in which the second color film includes: the second pixel color film located in the display region and at least partially non-overlapping with the first pixel color film, and the first frame color film located in the peripheral region and surrounding the display region. | S12 |

↓

| forming a third color film on the first color film, in which the third color film includes: a third pixel color film located in the display region and at least partially non-overlapping with the first pixel color film and the second pixel color film, and a second frame color film located in the peripheral region and surrounding the display region, and the second frame color film is located on a side of the first frame color film away from the bottom layer | S13a |

FIG. 9

DISPLAY SUBSTRATE AND MANUFACTURING METHOD THEREOF, DISPLAY DEVICE

This application is a U.S. National Phase Entry of International Application No. PCT/CN2019/102848 filed on Aug. 27, 2019, designating the United States of America. The present application claims priority to and the benefit of the above-identified application and the above-identified application is incorporated by reference herein in its entirety.

TECHNICAL FIELD

Embodiments of the present disclosure relate to a display substrate and manufacturing method thereof, and a display device.

BACKGROUND

Micro organic light emitting diode (Micro-OLED) display device is a new type of OLED display device based on silicon substrate, also known as silicon-based organic light emitting diode (Si-based OLED) display device. The silicon-based OLED display device has the advantages of small volume, high resolution and the like, and thus has a wide market application prospects, and for example, is suitable to be applied to helmet-mounted displays, stereoscopic display mirrors, spectacle displays and the like. At present, the color display of the silicon-based OLED display devices is generally realized by an organic light emitting diode (WOLED) emitting white light in combination with a color filter (CF).

SUMMARY

Embodiments of the present disclosure provide a display substrate and a manufacturing method thereof, and a display device. This display substrate can solve the problems of light reflection of a lower reflective structure and uneven coating of a last color film of the color film structure.

The embodiments of the present disclosure provide a display substrate, the display substrate includes: a base substrate, including a display region and a peripheral region surrounding the display region; a first light emitting element in the display region of the base substrate; and a color film structure on a display side of the first light emitting element. The color film structure includes: a first color film, including only a first pixel color film located in the display region; and a second color film, including a second pixel color film located in the display region and at least partially non-overlapping with the first pixel color film, and a first frame color film located in the peripheral region and surrounding the display region.

In some examples, the color film structure further includes: a third color film, including a third pixel color film located in the display region and at least partially non-overlapping with the first pixel color film and the second pixel color film; and a second frame color film located in the peripheral region and surrounding the display region, and the second frame color film is on a side of the first frame color film away from the base substrate.

In some examples, an orthographic projection of the second frame color film on the base substrate completely coincides with or falls within an orthographic projection of the first frame color film on the base substrate.

In some examples, a sum of a thickness of the first frame color film and a thickness of the second frame color film is greater than a thickness of the first pixel color film by 2 to 3 μm.

In some examples, the display substrate further including: a third color film, including only a third pixel color film located in the display region and at least partially non-overlapping with the first pixel color film and the second pixel color film.

In some examples, the first pixel color film is at least partially overlapped with the second pixel color film or the third pixel color film, and in an overlapped portion of the first pixel color film with the second pixel color film or the third pixel color film, the first pixel color film is on a side of the second pixel color film or the third pixel color film close to the base substrate.

In some examples, the first color film, the second color film and the third color film are color films of different colors.

In some examples, the first color film, the second color film and the third color film are respectively a red color film, a blue color film and a green color film.

In some examples, the first frame color film has an annular shape surrounding the display region.

In some examples, the display substrate further includes a sensing region in the peripheral region; the sensing region includes a plurality of sensing pixel units, each of the plurality of sensing pixel units includes a second light emitting element and a sensing circuit; the color film structure is on a side of the second light emitting element and the sensing circuit away from the base substrate, and an orthographic projection of the sensing region on the base substrate is within an orthographic projection of the first frame color film on the base substrate.

In some examples, the display substrate further includes a connection electrode region in the peripheral region, the connection electrode region is an annular region surrounding the display region and includes a plurality of annular connection electrodes; the color film structure is on a side of the plurality of annular connection electrodes away from the base substrate, and an orthographic projection of the connection electrode region on the base substrate is within an orthographic projection of the first frame color film on the base substrate.

In some examples, the display substrate further includes a first dummy region in the peripheral region, the first dummy region is located between the connection electrode region and the display region and includes a plurality of first dummy electrodes; the color film structure is on a side of the plurality of first dummy electrodes away from the base substrate, and an orthographic projection of the first dummy region on the base substrate is within the orthographic projection of the first frame color film on the base substrate.

In some examples, the display substrate further includes a second dummy region in the peripheral region, the second dummy region is located on the outermost periphery of the peripheral region to surround the first dummy region, the connection electrode region and the sensing region, and the second dummy region includes a plurality of second dummy electrodes; the color film structure is on a side of the plurality of second dummy electrodes away from the base substrate, and an orthographic projection of the second dummy region on the base substrate is within the orthographic projection of the first frame color film on the base substrate.

In some examples, the base substrate is a silicon substrate.

In some examples, a side of the silicon substrate facing the light emitting element includes a pixel circuit structure, and the pixel circuit structure is connected to the light emitting element, and at least part of the pixel circuit structure is in the silicon substrate.

In some examples, the display substrate further includes a thin film encapsulation layer, and the thin film encapsulation layer is on a side of the first color film facing the base substrate.

The embodiments of the present disclosure further provide a display device, including the display substrate as described above.

The embodiments of the present disclosure further provide a manufacturing method of a display substrate, the method includes: providing a base substrate, including a display region and a peripheral region surrounding the display region; forming a light emitting element in the display region of the base substrate; forming a first color film on the light emitting element, the first color film including only a first pixel color film in the display region; forming a second color film on the first color film, the second color film including a second pixel color film in the display region and at least partially non-overlapping with the first pixel color film, and a first frame color film in the peripheral region and surrounding the display region.

In some examples, the manufacturing method further includes: after forming the second color film, forming a third color film on the first color film; the third color film includes a third pixel color film located in the display region and at least partially non-overlapping with the first pixel color film and the second pixel color film, and a second frame color film located in the peripheral region and surrounding the display region; and the second frame color film is on a side of the first frame color film away from the base substrate.

In some examples, the manufacturing method further includes: after forming the first color film and before forming the second color film, forming a third color film on the first color film; the third color film includes only a third pixel color film located in the display region and at least partially non-overlapping with the first pixel color film and the second pixel color film.

In some examples, in the manufacturing method of the color film structure, the first pixel color film is at least partially overlapped with the second pixel color film or the third pixel color film, and in an overlapped portion of the first pixel color film with the second pixel color film or the third pixel color film, the first pixel color film is on a side of the second pixel color film or the third pixel color film close to the base substrate.

In some examples, forming at least one of the first color film, the second color film and the third color film includes coating a corresponding color film material layer using a spin coating method and patterning the corresponding color film material layer.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative of the present disclosure.

FIG. 7 is a schematic circuit diagram of a silicon-based organic light emitting display panel according to the embodiments of the present disclosure;

FIG. 8A is a flowchart of a manufacturing method of a color film structure according to the embodiments of the present disclosure;

FIG. 8B is a schematic structural diagram of a first color film according to the embodiments of the present disclosure;

FIG. 9 is another flowchart of the manufacturing method of the color film structure according to the embodiments of the present disclosure;

DETAILED DESCRIPTION

In order to make objects, technical details and advantages of the embodiments of the present disclosure apparent, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Similarly, similar words such as "a", "an" or "the" do not denote a limitation of quantity, but rather denote the presence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1:
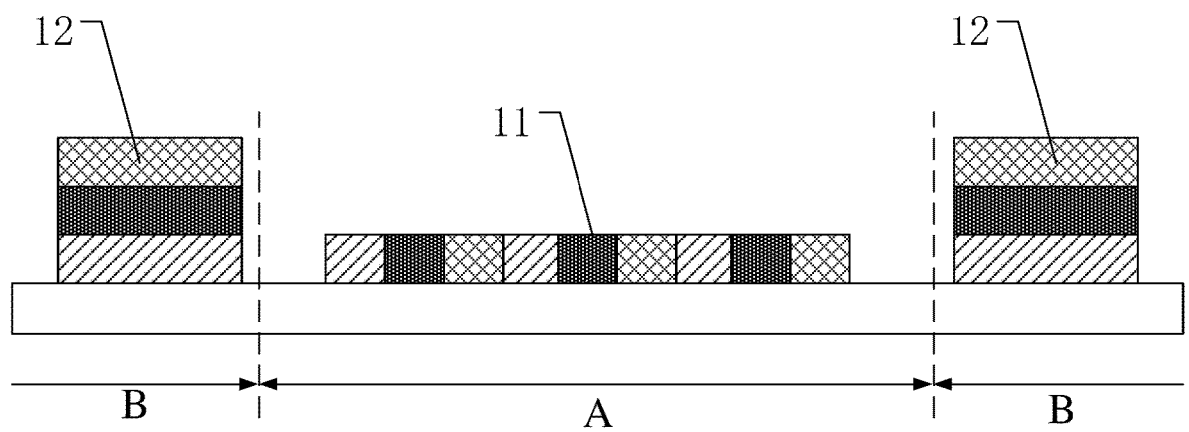
FIG. 1 is a schematic section view of a color film structure of a silicon-based organic light emitting diode di splay substrate.

FIG. 1 is a schematic section view of a color film structure of a silicon-based organic light emitting diode display substrate. As illustrated in FIG. 1, the silicon-based organic light emitting diode (Si-based OLED) display substrate includes a display region A and a peripheral region B surrounding the display region A. The color film structure includes a pixel color film 11 located in the display region A and a frame color film 12 located in the peripheral region B. The frame color film 12 shields a reflective structure provided below the frame color film 12, such as a metal lead connecting a light emitting element of the display substrate, a pixel sensing circuit, and the like, so as to prevent the reflective structure from reflecting light to affect the display effect of the display region.

In practical application, the inventors of this application found that the frame color film is formed by stacking three layers of color films. Although the reflective structure is shielded, the thickness of the frame color film in the peripheral region is 3 times of the thickness of the pixel color film in the display region, and thus a circle of a thick dam is formed in the peripheral region. In the process of coating the color film by spin coating method, the dam twice as thick as the pixel color film is formed after first two color films are formed, so that during the last layer of color film is coated, the last layer of color film coated on the display region is uneven, thereby resulting in a brightness mura phenomenon during the display of the formed display substrate.

The embodiments of the present disclosure provide a color film structure and a manufacturing method thereof, a display substrate and a mask plate group. The color film structure includes a bottom layer, and a first color film and a second color film that are positioned on the bottom layer. The bottom layer includes a display region and a peripheral region surrounding the display region. The first color film includes only a first pixel color film located in the display region. The second color film includes: a second pixel color film located in the display region and at least partially non-overlapping with the first pixel color film, and a first frame color film located in the peripheral region and surrounding the display region. The second color film of the color film structure includes the first frame color film positioned in the peripheral region and surrounding the display region, so that the problem of light reflection of the reflective structure provided at a lower layer of the display substrate can be solved. In addition, the first color film of the color film structure only includes the first pixel color film located in the display region, so that the thickness of the dam in the peripheral region is reduced, and the problem of uneven coating of the last layer of color film can be solved.

The color film structure, the manufacturing method thereof, the display substrate and the mask plate group provided by the embodiments of the present disclosure will be described below with reference to the accompanying drawings.

Figure 2A:
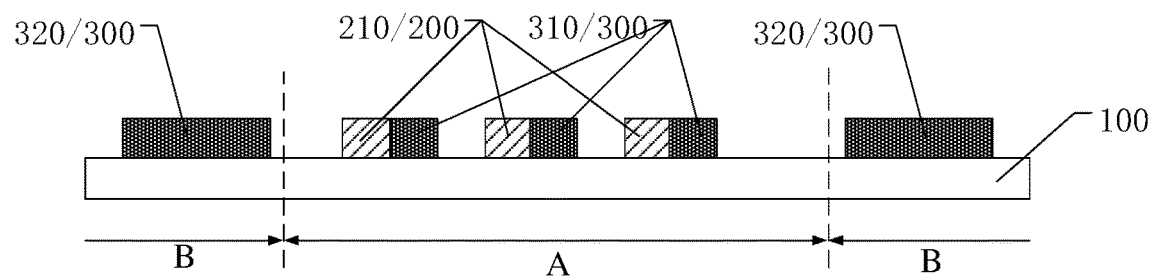
FIG. 2A is a schematic section view of a color film structure according to embodiments of the present disclosure.
Figure 2B:
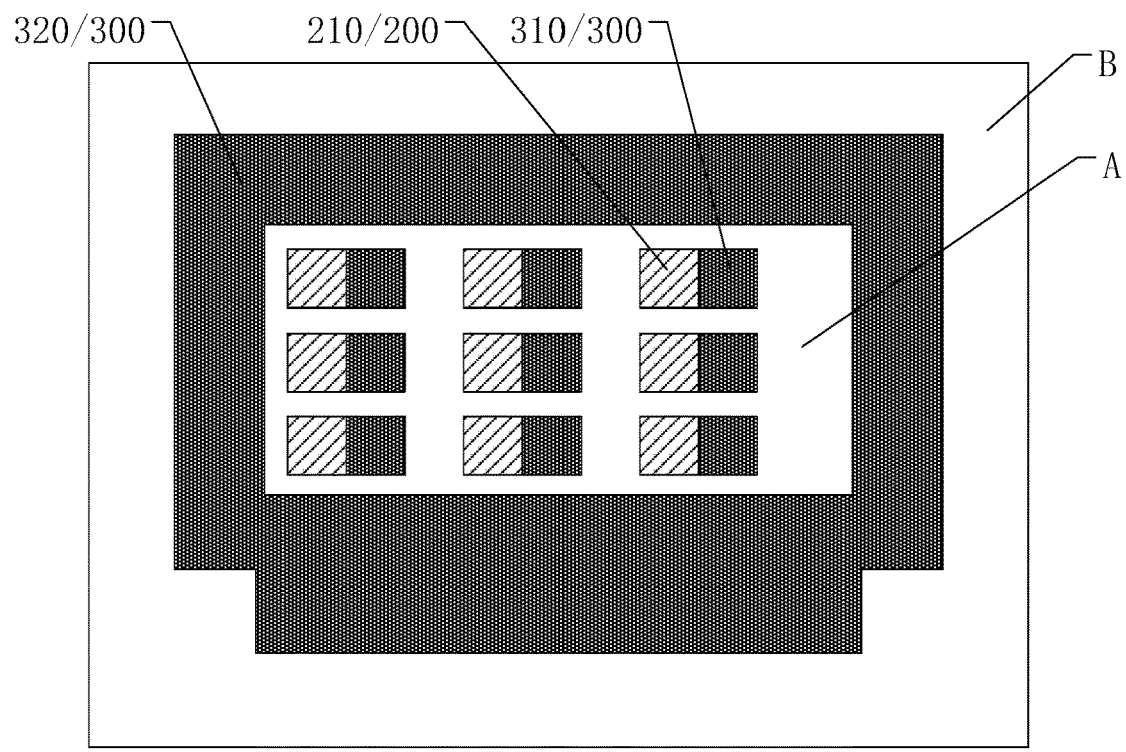
FIG. 2B is a schematic plan view of the color film structure illustrated in FIG. 2A.

Embodiments of the present disclosure provide the color film structure. FIG. 2A is a schematic section view of the color film structure, and FIG. 2B is a schematic plan view of the color film structure illustrated in FIG. 2A. As illustrated in FIGS. 2A and 2B, the color film structure includes a bottom layer 100, a first color film 200 and a second color film 300 that are on the bottom layer 100. The bottom layer 100 includes a display region A and a peripheral region B surrounding the display region. For example, the display region A is a region for displaying a picture, i.e., a light emitting region; the peripheral region B is a region where the picture is not displayed, that is, a non-light emitting region. For example, the bottom layer 100 is a transparent bottom layer.

As illustrated in FIGS. 2A and 2B, the first color film 200 includes only a first pixel color film 210 located in the display region A. The second color film 300 includes: a second pixel color film 310 located in the display region A and at least partially non-overlapping with the first pixel color film 210, and a first frame color film 320 located in the peripheral region B and surrounding the display region A.

The color film structure illustrated in FIGS. 2A and 2B includes two color films, and the peripheral region of the display substrate including the color film structure includes the first frame color film. The first frame color film can solve the problem of light reflection of the reflective structure provided at the lower layer of the peripheral region of the display substrate. In addition, the peripheral region of the display substrate including the color film structure only includes the first frame color film, so that the thickness of the dam in the peripheral region is reduced, and the problem of uneven color film coating can be solved.

In some examples, as illustrated in FIG. 2B, the shape of the first frame color film 320 of the second color film 300 is a closed annular shape. That is, the first frame color film is a continuous annular light shielding layer located in the peripheral region to prevent the reflective structure located in the peripheral region of the display substrate including the color film structure from reflecting light, thereby improving the display effect of the display substrate.

In some examples, the first frame color film 320 of the second color film 300 covers a part of the peripheral region B or all of the peripheral region B as illustrated in FIG. 2B, and the present disclosure is not limited thereto.

For example, as illustrated in FIGS. 2A and 2B, the first pixel color film 210 located in the display region A includes a plurality of first sub pixel color films arranged in an array, and adjacent first sub pixel color films have a certain distance between them to remain a space for subsequently formed pixel color films of different colors. The second pixel color film 310 includes a plurality of second sub pixel color films. The second sub pixel color film and the first sub pixel color film at least partially do not overlap with each other; for example, one side of the second sub pixel color film is connected to the first sub pixel color film while the other side of the second sub pixel color film has a certain distance from the first sub pixel color film, and then the pixel color films with different colors from the first sub pixel color film and the second sub pixel color film are formed. Of course, the present disclosure is not limited to this, and the first sub pixel color film and the second sub pixel color film for example are alternately arranged and connected with each other. In the embodiments of the present disclosure, the first pixel color film and the second pixel color film located in the display region are configured to respectively face the light emitting element in the display substrate including the color film structure to perform color filtering on the white light emitted by the light emitting element.

For example, the second pixel color film partially overlaps with the first pixel color film, and the overlapped portion of the second pixel color film and the first pixel color film plays a shading role, thereby avoiding the formation of the black matrix. For example, the second pixel color film is spaced from the first pixel color film, and a black matrix is provided at a gap between the second pixel color film and the first pixel color film to prevent crosstalk.

Figure 3:
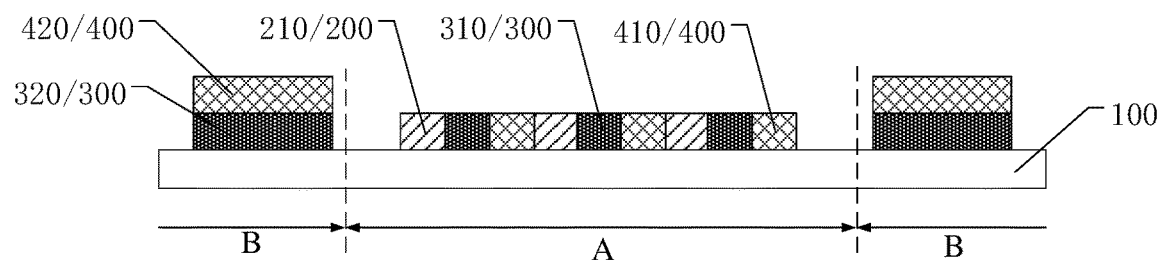
FIG. 3 is another schematic section view of the color film structure according to the embodiments of the present disclosure.

FIG. 3 is another schematic section view of the color film structure. As illustrated in FIG. 3, the color film structure further includes a third color film 400. The third color film 400 includes: a third pixel color film 410 located in the display region A and at least partially non-overlapping with the first pixel color film 210 and the second pixel color film 310, and a second frame color film 420 located in the peripheral region B and surrounding the display region A. The second frame color film 420 is located on the side of the first frame color film 320 away from the bottom layer 100. For example, the second frame color film 420 is a closed annular color film surrounding the display region A.

In some examples, the orthographic projection of the second frame color film 420 on the bottom layer completely coincides with the orthographic projection of the first frame color film 320 on the bottom layer, or the orthographic projection of the second frame color film 420 on the bottom layer falls within the orthographic projection of the first frame color film 320 on the bottom layer. The first frame color film and the second frame color film together play a role of shading the peripheral region.

In some examples, the thicknesses of the first pixel color film, the second pixel color film, the third pixel color film, the first frame color film, and the second frame color film are equal to each other. At this time, the sum of the thicknesses of the first frame color film and the second frame color film is twice of the thickness of the first pixel color film. Of course, the thicknesses of the first pixel color film, the second pixel color film, the third pixel color film, the first frame color film and the second frame color film may not be equal to each other, and the present disclosure is not limited to this.

In some examples, the sum of the thicknesses of the first frame color film and the second frame color film (i.e., the thickness of the dam) is greater than the thickness of the first pixel color film by 2 to 3 μm.

The color film structure illustrated in FIG. 3 includes three color films, and the peripheral region of the display substrate including the color film structure includes the first frame color film and the second frame color film. The two layers of frame color films can solve the problem of light reflection of the reflective structure provided at the lower layer of the peripheral region of the display substrate. Moreover, the display substrate including the color film structure includes two layers of frame color films, and compared with the display substrate including three layers of frame color films, the thickness of the dam is reduced, so that the problem of uneven coating of the color film can be solved.

Figure 4:
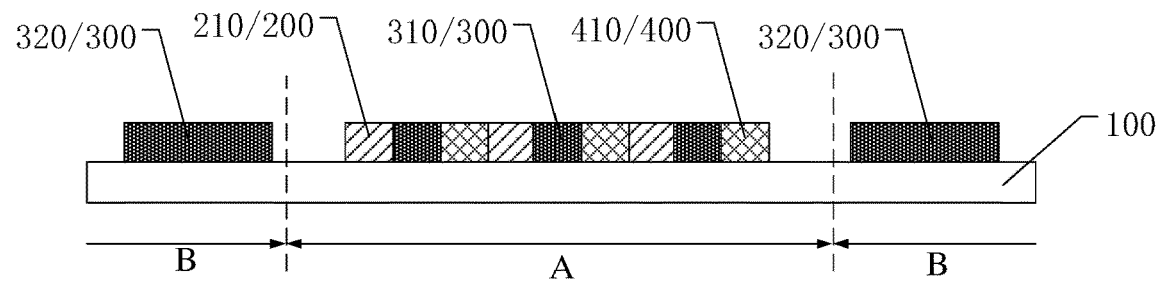
FIG. 4 is another schematic section view of the color film structure according to the embodiments of the present disclosure.

FIG. 4 is another schematic section view of the color film structure. As illustrated in FIG. 4, the third color film 400 of the color film structure includes only the third pixel color film 410 located in the display region and at least partially non-overlapping with the first pixel color film 210 and the second pixel color film 310.

The color film structure illustrated in FIG. 4 includes three color films, and the peripheral region of the display substrate including the color film structure includes the first frame color film. The above first frame color film can solve the problem of light reflection of the reflective structure provided at the lower layer of the peripheral region of the display substrate. Moreover, the display substrate including the color film structure only includes the first frame color film in the peripheral region, and compared with the display substrate including three layers of frame color films, the thickness of the dam is reduced, so that the problem of uneven coating of the color film can be solved.

In some examples, the first pixel color film 210 at least partially overlaps with the second pixel color film 310 or the third pixel color film 410, and in the overlapped portion of the first pixel color film 210 with the second pixel color film 310 or the third pixel color film 410, the first pixel color film 210 is located on the side of the second pixel color film 310 or the third pixel color film 410 close to the bottom layer 100. The portion where the first pixel color film overlaps with the second pixel color film or the third pixel color film can play a role of the black matrix.

The colors of the first color film 200, the second color film 300, and the third color film 400 are different from each other. For example, the first color film is a red color film, the second color film is a blue color film, and the third color film is a green color film. It should be noted that the colors and forming sequence of the first color film, the second color film and the third color film can be adjusted according to the actual requirements of the product. In addition, it should be noted that the color film formed first includes only the pixel color film and does not include the frame color film, so that the thickness of the color film formed later by the spin coating process is relatively uniform. However, one or two layers of the color films formed later can have the frame color film, so that the peripheral region can be shielded from light.

Figure 5:
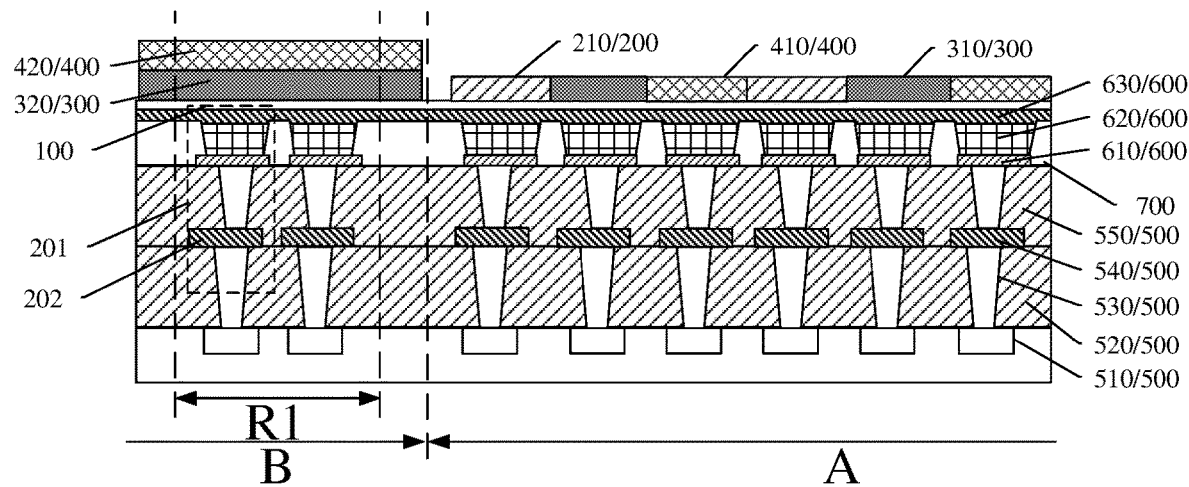
FIG. 5 is a schematic section view of a display substrate according to the embodiments of the present disclosure.

The embodiments of the present disclosure provide a display substrate including the color film structure provided in any of the above embodiments. FIG. 5 is a schematic section view of the display substrate. As illustrated in FIG. 5, the display substrate further includes a base substrate 500, a light emitting element 600, and the color film structure. The light emitting element 600 is located on the substrate 500 and includes a first light emitting element that is located in the display region A and a second light emitting element that is located in the peripheral region B. The color film structure is located on the display side of the light emitting element 600, and may be the color film structure provided in any of the above embodiments.

As illustrated in FIG. 5, the display substrate further includes a sensing region R1. For example, the position of the sensing region R1 corresponds to the peripheral region B of the bottom layer of the color film structure. For example, the frame color film covers the sensing region R1. The sensing region R1 includes a plurality of sensing pixel units 201, as illustrated by a dashed box in the figure. Each sensing pixel unit 201 includes the light emitting element 600 and a sensing circuit structure 202. The sensing circuit structure 202 is configured to detect the voltage at one end of the light emitting element 600. The sensing circuit structure for example is connected to a temperature sensor, and the sensing circuit structure is located on the side of the color film structure facing the base substrate 500. The color film structure is located on the side of the light emitting element 600 and the sensing circuit structure 202 away from the base substrate 500, and the orthographic projection of the sensing region R1 on the base substrate 500 is located within the orthographic projection of the first frame color film 320 on the base substrate 500. For example, the color film structure includes the second frame color film 420, the orthographic projection of the sensing region R1 on the base substrate 500 is further located within the orthographic projection of the second frame color film 420 on the base substrate 500.

For example, the light emitting element is an organic light emitting diode (OLED), such as a Micro-OLED or a Mini-OLED, which is configured to emit white light.

For example, the light emitted by the sensing pixel units of the sensing region R1 includes light emitted by the light emitting elements of the plurality of sensing pixel units and light reflected by the metal reflective structure in the sensing circuit structures of the plurality of sensing pixel units.

In this way, the first frame color film and the second frame color film play a role of shading the light emitted by the light emitting elements of the sensing pixel units and the metal reflective structure in the sensing circuit structures.

In some examples, as illustrated in FIG. 5, the base substrate 500 is a silicon substrate 500, and the side of the silicon substrate 500 facing the light emitting element 600 includes a pixel circuit structure 510 connected to the light emitting element 600. That is, the pixel circuit structure 510 is integrated on the silicon substrate 500.

For example, a gate drive circuit and a data drive circuit are also integrated on the silicon substrate, and a flexible printed circuit board is provided in the peripheral region of the silicon substrate and configured to transmit electrical signals to the gate drive circuit, the data drive circuit, and the light emitting element. For example, the gate drive circuit is configured to generate a gate drive signal, and the data drive circuit is configured to generate a data signal. The gate drive circuit and the data drive circuit may adopt a conventional circuit structure in the art, and the embodiments of the present disclosure are not limited thereto.

For example, the pixel circuit structure 510 is configured to supply a driving current to the light emitting element 600 under the control of driving signals such as the gate scanning signal, the data signal, a voltage signal, and the like to cause the organic light emitting layer included in the light emitting element to emit light. For example, the pixel circuit structure 510 adopts the pixel circuit structure such as 4T1C, 4T2C, 7T1C, 8T2C, and the driving method thereof adopts conventional methods in the art, which will not be described here. For example, the pixel circuit structure is fabricated on the silicon substrate by CMOS process, and the embodiments of the present disclosure are not limited to this.

For example, as illustrated in FIG. 5, the silicon substrate 500 further includes a first insulating layer 520 and a second insulating layer 550 located between the pixel circuit structure 510 and the light emitting element 600, and via holes 530 are provided in the two insulating layers. For example, the via holes 530 are tungsten holes each filled with tungsten metal. In the case that the sum of the thicknesses of the first insulating layer 520 and the second insulating layer 550 is large, forming the tungsten via holes in the first insulating layer 520 and the second insulating layer 550 ensures the stability of the conductive path. Moreover, because the process of forming the tungsten via hole is mature, the surface flatness of the first insulating layer 520 and the surface flatness of the second insulating layer 550 are good, which is beneficial to reducing the contact resistance between the first insulating layer 520 and the second insulating layer 550 and the electrode included in the light emitting element 600.

For example, as illustrated in FIG. 5, a metal layer 540 is arranged between the via hole 530 in the first insulating layer 520 and the via hole 530 in the second insulating layer to electrically connect the light emitting element 600 with the pixel circuit structure 510.

For example, as illustrated in FIG. 5, the light emitting element 600 includes a first electrode 610, an organic light emitting layer 620, and a second electrode 630 which are sequentially stacked. The first electrode 610 is electrically connected to the pixel circuit structure 510 through the via hole 530 located in the insulating layer, and the pixel circuit structure 510 is configured to drive the light emitting element 600 to emit light. The light emitting element 600 includes a plurality of light emitting sub elements, and organic light emitting layers 620 of adjacent light emitting sub elements are separated from each other by a pixel defining layer 700.

For example, the pixel circuit 510 includes at least a driving transistor and a switching transistor, and the driving transistor and the first electrode 610 are electrically connected to each other. Thus, an electrical signal for driving the light emitting element 600 is transmitted to the first electrode 610, thereby controlling the light emitting element 600 to emit light. For example, the drive transistor includes a gate electrode, a source electrode, and a drain electrode. The source electrode of the drive transistor is electrically connected to the first electrode 610. The drive transistor is in the ON state, the electrical signal provided by the power supply line is transmitted to the first electrode 610 through the source electrode of the drive transistor. Because a voltage difference is formed between the first electrode 610 and the second electrode 630, an electric field is formed therebetween, and the organic light emitting layer 620 emits light under the action of the electric field.

For example, as illustrated in FIG. 5, the light emitting sub elements included in the light emitting element 600 and the sub pixel color films are in one to one correspondence. For example, the light emitted by the light emitting element 600 is white light, and the color display is realized after the white light passes through the pixel color films of different colors located on the display side of the light emitting element 600.

For example, as illustrated in FIG. 5, the sensing region R1 located in the peripheral region B is provided with the light emitting element same as the light emitting element 600 in the display region A. The light emitting element located in the sensing region R1 is not used for display, but for detecting the attenuation degree of pixel light emission, so it needs to be shielded by the frame color film located in the peripheral region B.

In some examples, as illustrated in FIG. 5, the display substrate further includes a thin film encapsulation layer on the second electrode 630, the bottom layer 100 is the thin film encapsulation layer, and the thin film encapsulation layer is located on the side of the first color film 200 facing the light emitting element 600.

For example, the bottom layer 100 is the first thin film encapsulation layer, and a second thin film encapsulation layer is arranged on the side of the color film structure away from the light emitting element 600. The first thin film encapsulation layer and the second thin film encapsulation layer realize effective encapsulation of the light emitting element, realize effective blocking of water vapor, oxygen and the like, and achieve the purposes of protecting the light emitting element and prolonging the service life of the light emitting element.

For example, a cover plate is arranged on the side of the second film encapsulation layer away from the color film structure, and the second film encapsulation layer and the cover plate are sequentially arranged on the color film structure, so that the effect of protecting the color film structure is realized. For example, the second thin film encapsulation layer is made by one or more of organic materials or inorganic materials with good sealing characteristics to achieve good sealing effect and protect the silicon-based OLED display device. For example, the cover plate is made of a transparent material, for example, the transparent material is an inorganic material such as glass or an organic material such as polyimide. For example, in the embodiments of the present disclosure, glass having high transmittance is used, and the embodiments of the present disclosure are not limited thereto.

Figure 6A:
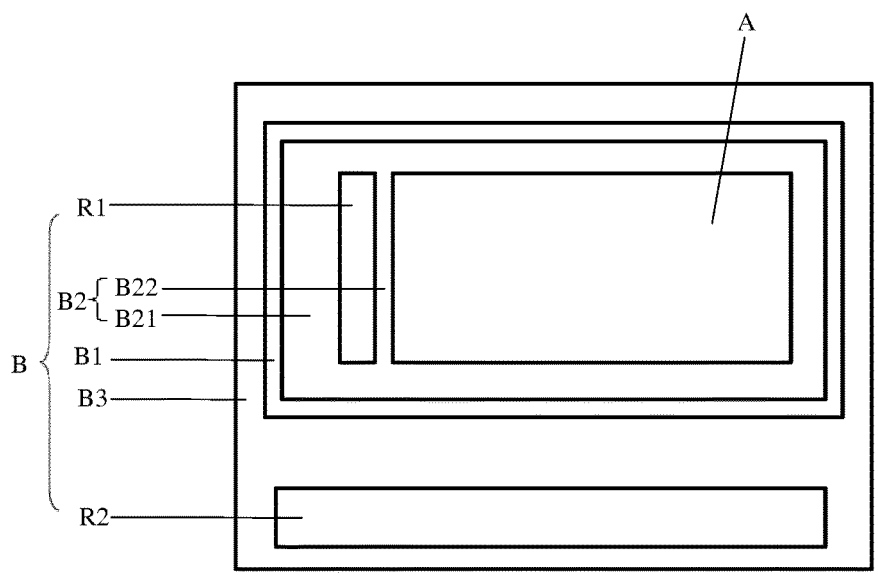
FIG. 6A is a schematic diagram of region division of the display substrate according to the embodiments of the present disclosure.

FIG. 6A is a schematic diagram of region division of the display substrate according to the embodiments of the present disclosure. As illustrated in FIG. 6A, the display substrate includes the display region A and the peripheral region B surrounding the display region A. The peripheral region B includes a connection electrode region B1, a first dummy region B2, a second dummy region B3, the sensing region R1, and a pad region R2.

The first dummy region B2 is located between the connection electrode region B1 and the display region A, and the second dummy region B3 is located on the side of the connection electrode region B1 away from the display region A. A portion of the first dummy region B2 located between the sensing region R1 and the connection electrode region B1 is a first dummy sub region B21. A portion of the first dummy region B2 located between the sensing region R1 and the display region A is a second dummy sub region B22. The pad region R2 is used for external circuit connection.

In some examples, the peripheral region B does not include the sensing region R1, i.e., the peripheral region B includes the connection electrode region B1, the first dummy region B2, the second dummy region B3, and the pad region R2.

The first dummy region B2 avoids the short circuit between the element in the display region and the element in the connection electrode region B1 that should be insulated from each other, and the second dummy region B3 facilitates the encapsulation of the display substrate and improves the encapsulation effect.

Figure 6B:
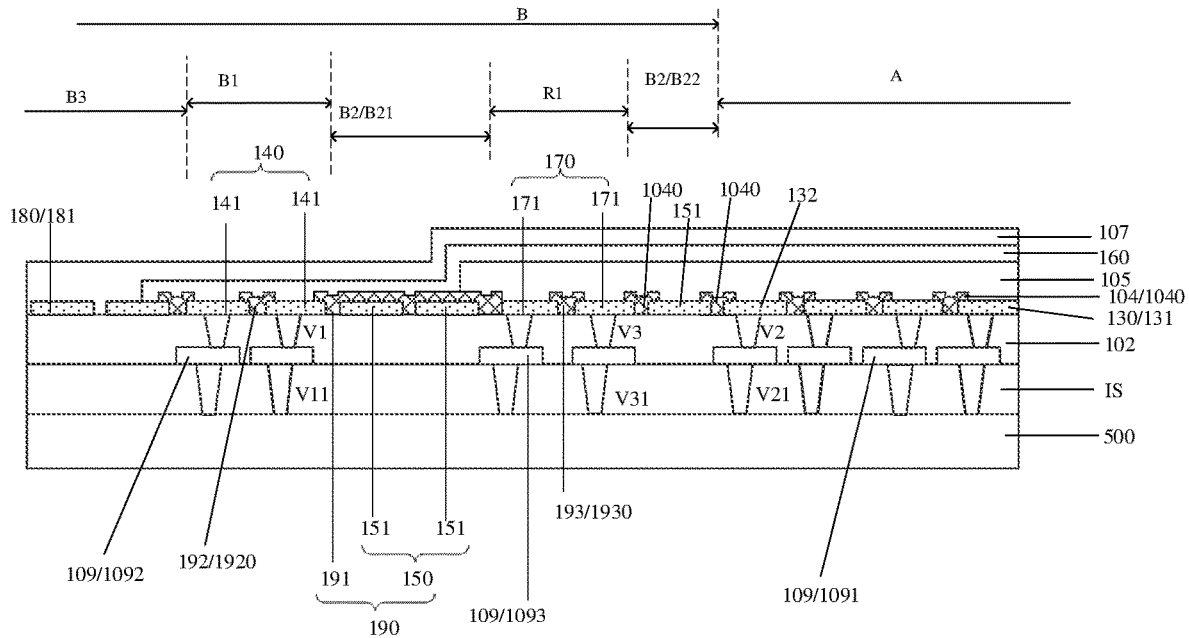
FIG. 6B is a schematic section view of the display substrate illustrated in FIG. 6A.

FIG. 6B is a schematic section view of the display substrate illustrated in FIG. 6A. As illustrated in FIG. 6B, the display substrate includes: a base substrate 500; a first electrode pattern 130, which is located in the display region A of the display substrate and includes a plurality of first electrodes 131 spaced apart from each other; a connection electrode pattern 140, which is located in the connection electrode region B1 of the display substrate and includes a plurality of connection electrodes 141; and a first dummy electrode pattern 150, which is located in the first dummy region B2 of the display substrate and includes a plurality of first dummy electrodes 151. As illustrated in FIGS. 6A and 6B, the connection electrode region B1 surrounds the display region A, and the first dummy region B2 is located between the connection electrode region B1 and the display region A. The connection electrode pattern 140 surrounds the first electrode pattern 130, and the first dummy electrode pattern 150 surrounds the first electrode pattern 130. The first dummy electrode pattern 150 is located between the connection electrode pattern 140 and the first electrode pattern 130. For example, the connection electrode pattern 140 has an annular shape. The first dummy electrode pattern 150 is provided, which is beneficial to improving etching uniformity.

For example, the color film structure is located on the side of the plurality of connection electrodes away from the base substrate 500, and the orthographic projection of the connection electrode region B1 on the base substrate 500 is located in the orthographic projection of the first frame color film 320 on the base substrate 500.

For example, the color film structure is located on the side of the plurality of first dummy electrodes away from the base substrate 500, and the orthographic projection of the first dummy region B2 on the base substrate 500 is located within the orthographic projection of the first frame color film 320 on the base substrate 500.

For example, as illustrated in FIG. 6B, the display substrate provided in the embodiments of the present disclosure further includes a second electrode 160, and the second electrode is connected to the connection electrode 141. The peripheral region B of the display substrate surrounds the display region A, and the peripheral region B includes the connection electrode region B1 and the first dummy region B2. The second electrode 160 is located in the display region A and the peripheral region B, and the second electrode 160 and the first electrode pattern 130 are spaced apart from each other.

For example, as illustrated in FIG. 6B, at least two of the pattern density of the first electrode pattern 130, the pattern density of the connection electrode pattern 140, and the pattern density of the first dummy electrode pattern 150 are same as each other.

For example, as illustrated in FIG. 6B, the display substrate provided by the embodiments of the present disclosure further includes a sensor electrode pattern 170, the sensor electrode pattern is located in the sensing region R1 of the display substrate and includes a plurality of sensor electrodes 171. For example, the pattern density of the sensor electrode pattern 170 is the same as the pattern density of the first electrode pattern 130.

For example, as illustrated in FIG. 6B, the display substrate provided by the embodiments of the present disclosure further includes a second dummy electrode pattern 180 located in the second dummy region B3 of the display substrate and including a plurality of second dummy electrodes 181. The second dummy region B3 is located on the side of the connection electrode region B1 away from the display region A. For example, the pattern density of the second dummy electrode pattern 180 is the same as the pattern density of the first electrode pattern 130. In the display substrate provided by the embodiments of the present disclosure, for example, the pattern density of the first electrode pattern 130, the pattern density of the connection electrode pattern 140, the pattern density of the sensor electrode pattern 170, the pattern density of the first dummy electrode pattern 150, and the pattern density of the second dummy electrode pattern 180 are same as each other.

For example, the second dummy region B3 is located at the outermost periphery of the peripheral region and surrounds the first dummy region, the connection electrode region, and the sensing region. The second dummy region B3 includes a plurality of second dummy electrodes. The color film structure is located at the side of the plurality of second dummy electrodes away from the base substrate, and the orthographic projection of the second dummy region on the base substrate is located in the orthographic projection of the first frame color film on the base substrate.

For example, the plurality of connection electrodes 141 are block-shaped electrodes, and the plurality of block-shaped connection electrodes 141 form an annular-shaped connection electrode pattern 140. The plurality of first dummy electrodes 151 are block-shaped electrodes, and the plurality of block-shaped first dummy electrodes 151 form an annular-shaped first dummy electrode pattern 150. The plurality of second dummy electrodes 181 are block-shaped electrodes, and the plurality of block-shaped second dummy electrodes 181 form an annular-shaped second dummy electrode pattern 180.

For example, the second electrode 160 is the cathode of the light emitting element, and the connection electrode 141 is configured to connect the cathode of the light emitting element and a power signal. The first dummy electrode 151 and the second dummy electrode 181 are both floated, that is, are not supplied with any electrical signal.

For example, as illustrated in FIG. 6B, the first dummy sub-region B21 is provided with a first filling layer 190, and the first filling layer 190 includes the plurality of first dummy electrodes 151 and an insulating filling layer 191. For example, the first electrode pattern 130 includes an edge first electrode 132 adjacent to the connection electrode 141, and the insulating filling layer 191 is respectively in contact with the connection electrode 141 and the edge first electrode 132 for example in the case that the display substrate does not include the sensing region R1. For example, as illustrated in FIG. 6B, the second electrode 106 is in contact with the insulating filling layer 191. For example, as illustrated in FIG. 6B, the edge first electrode 132 and the plurality of first dummy electrodes 151 are insulated from each other.

For example, as illustrated in FIG. 6B, the display substrate further includes a pixel defining layer 104, the pixel defining layer 104 includes a plurality of pixel defining portions 1040, each of the pixel defining portions 1040 is located between adjacent first electrodes 131.

For example, as illustrated in FIG. 6B, the insulating filling layer 191 and the pixel defining layer 104 are located in the same layer and for example are formed by the same film using the same patterning process to simplify the manufacturing process.

For example, as illustrated in FIG. 6B, the first electrode pattern 130, the connection electrode pattern 140, the sensor electrode pattern 170, the first dummy electrode pattern 150, and the second dummy electrode pattern 180 are located in the same layer and for example are formed by the same film using the same patterning process to simplify the manufacturing process.

For example, as illustrated in FIG. 6B, the display substrate further includes a second filling layer 192, the second filling layer 192 includes at least one second filling portion 1920 located between adjacent connection electrodes 141. For example, the second filling layer 192 is an insulating layer. For example, as illustrated in FIG. 6B, the second filling portion 1920 is respectively in contact with the adjacent connection electrodes 141.

For example, as illustrated in FIG. 6B, the second filling layer 192 and the first filling layer 190 are located in the same layer and for example are formed by the same film using the same patterning process to simplify the manufacturing process.

For example, as illustrated in FIG. 6B, the display substrate further includes a third filling layer 193, the third filling layer 193 includes a plurality of third filling portions 1930, the third filling portion 1930 is located between adjacent sensor electrodes 171 and/or is located between the sensor electrode 171 and first dummy electrode that are adjacent to each other. FIG. 6B illustrates an example in which the third filling portion 1930 is located between adjacent sensor electrodes 171.

For example, as illustrated in FIG. 6B, the third filling layer 193 and the pixel defining layer 104 are located in the same layer and for example are formed by the same film using the same patterning process to simplify the manufacturing process. For example, as illustrated in FIG. 6B, the pixel defining layer 104, the insulating filling layer 191, the second filling layer 192, and the third filling layer 193 are located in the same layer.

For example, as illustrated in FIG. 6B, the display substrate further includes a light emitting functional layer 105, the light emitting functional layer 105 is located between the first electrode pattern 130 and the second electrode 160, and the light emitting functional layer 105 is in contact with the first filling layer 190. For example, the light emitting functional layer 105 is in contact with a portion of the first filling layer 190. For example, as illustrated in FIG. 6B, the light emitting functional layer 105 extends to the first dummy sub region B21. The light emitting functional layer 105 covers the entire display region A, the entire sensing region R1, the entire second dummy sub region B22, and a portion of the first dummy sub region B21, and the light emitting functional layer 105 is prevented from extending to the connection electrode region B1 to cause a short circuit between the first electrode and the second electrode. For example, as illustrated in FIG. 6B, the second electrode 160 extends from the display region A to the second dummy region B3 of the peripheral region B to facilitate connection of the second electrode 160 and the connection electrode 141.

For example, as illustrated in FIG. 6B, the light emitting functional layer 105 is in contact with the sensor electrode pattern 170. For example, as illustrated in FIG. 6B, the light emitting functional layer 105 is not in contact with the first dummy electrode 151 located in the first dummy sub region B21, but the embodiments of the disclosure are not limited thereto.

As illustrated in FIG. 6B, the base substrate 500 is further provided with an insulating layer IS, a conductive pattern 109 is provided on the insulating layer IS, and the conductive pattern 109 includes a first conductive portion 1091, a second conductive portion 1092, and a third conductive portion 1093. The insulating layer IS includes a third via hole V11, a fourth via hole V21, and a fifth via hole V31. The third via hole V11, the fourth via hole V21, and the fifth via hole V31 are respectively filled with conductive materials to form connection members. The first electrode 131 is connected to the connection member in the fourth via hole V21 through the first conductive portion 1091. The connection electrode 141 is connected to the connection member in the third via hole V11 through the second conductive portion 1092. The sensor electrode 171 is connected to the connection member in the fifth via hole V31 through the third conductive portion 1093. It should be noted that other structures may be provided between the base substrate 500 and the insulating layer IS, which are not illustrated in FIG. 6B.

In some examples, the display substrate does not include the pixel defining layer 104.

As illustrated in FIG. 6B, the display substrate further includes an encapsulation layer 107. The encapsulation layer 107 is configured to encapsulate the light emitting element to prevent water and oxygen from invading into the light emitting element. As illustrated in FIG. 6B, the encapsulation layer 107 covers the second electrode 160, the connection electrode pattern 140, and the second dummy electrode pattern 180. As illustrated in FIG. 6B, the encapsulation layer 107 covers the entire base substrate 500 and all structures provided on the base substrate 500.

Figure 6C:
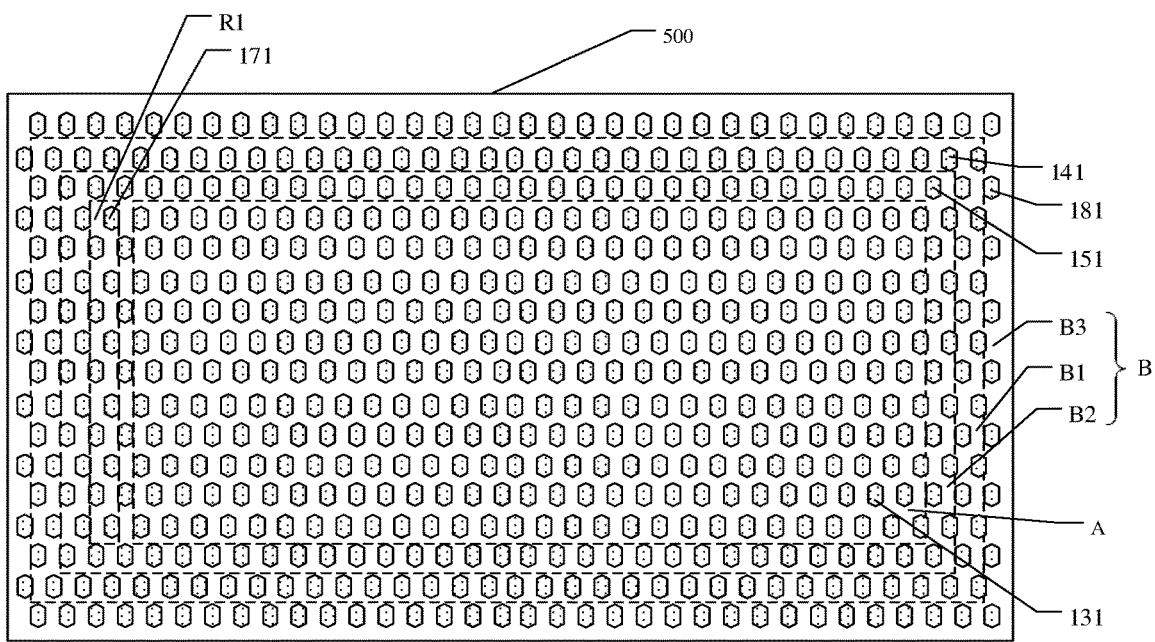
FIG. 6C is a schematic top view of the display substrate illustrated in FIGS. 6A and 6B.

FIG. 6C is a schematic top view of the display substrate illustrated in FIGS. 6A and 6B. FIG. 6C illustrates the display region A, the peripheral region B, the connection electrode region B1, the first dummy region B2, the second dummy region B3, and the sensor electrode 171. For example, the pattern density of the sensor electrode pattern 170, the pattern density of the first electrode pattern 130, the pattern density of the connection electrode pattern 140, the pattern density of the first dummy electrode pattern 150, and the pattern density of the second dummy electrode pattern 180 are same as each other. That is, the pattern density of the plurality of sensor electrodes 171, the pattern density of the plurality of first electrodes 131, the pattern density of the plurality of connection electrodes 141, the pattern density of the plurality of first dummy electrodes 151 and the pattern density of the plurality of second dummy electrodes 181 are same as each other.

For example, as illustrated in FIG. 6C, the first dummy electrode 151 is block-shaped electrode.

For example, as illustrated in FIG. 6C, the second dummy electrode 181 is block-shaped electrode.

For example, as illustrated in FIG. 6C, each of the sensor electrode 171, the first electrode 131, the connection electrode 141, the first dummy electrode 151, and the second dummy electrode 181 is block-shaped electrode.

The display substrate further includes the color film substrate provided in any of the above embodiments, which is located on the side of the encapsulation layer 107 away from the base substrate 500, not illustrated in FIG. 6B.

For example, the orthographic projection of the connection electrode region B1 on the base substrate is located within the orthographic projection of the first frame color film on the base substrate.

For example, the orthographic projection of the first dummy region B2 on the base substrate is located within the orthographic projection of the first frame color film on the base substrate.

For example, the orthographic projection of the sensing region R1 on the base substrate is located in the orthographic projection of the first frame color film on the base substrate.

For example, the orthographic projection of at least a portion of the second dummy region B3 on the base substrate is located within the orthographic projection of the first frame color film on the base substrate.

The technical effects of the display substrate provided by the embodiments of the present disclosure are the same as these of the color film structure provided by the embodiments of the present disclosure, and will not be repeated here.

The embodiments of the present disclosure provide an organic light emitting display panel including the display substrate provided in any of the above embodiments.

FIG. 7 is a schematic circuit diagram of thesilicon-based organic light emitting display panel according to the embodiments of the present disclosure. The silicon-based organic light emitting display panel includes a plurality of display elements L (i.e., light emitting elements) located in the display region A and pixel circuits 110 respectively coupled to the display elements L in one to one correspondence, and the pixel circuits 110 include driving transistors. Moreover, the silicon-based organic light emitting display panel for example further includes a plurality of voltage control circuits 120 located in the peripheral region of the silicon-based organic light emitting display panel (the peripheral region is a region other than the display region A of the silicon-based organic light emitting display panel, which is not illustrated in the figure). For example, at least two pixel circuits 110 in a row share a same voltage control circuit 120, and first poles of the drive transistors in a row of pixel circuits 110 are coupled to the shared voltage control circuit 120, and second poles of the drive transistors are respectively coupled to corresponding display elements L. The voltage control circuit 120 is configured to output the initialization signal Vinit to the first pole of the drive transistor in response to the reset control signal RE to control the reset of the corresponding display device L, and is configured to output the first power supply signal VDD to the first pole of the driving transistor in response to the light emission control signal EM to drive the display device L to emit light. The silicon-based organic light emitting display panel further includes a second power signal VSS located in the display region for inputting the second power signal to the light emitting element L. It should be noted that the reset control signals RE corresponding to the voltage control circuits 120 are not necessarily the same, and the light emission control signals EM corresponding to the voltage control circuits 120 are not necessarily different. By sharing the voltage control circuit 120, the structure of each pixel circuit in the display region A can be simplified, and the occupied area of the pixel circuit in the display region A can be reduced, so that more pixel circuits and display elements can be arranged in the display region A, and the organic light emitting display panel with high PPI can be realized. In addition, the voltage control circuit 120 outputs the initialization signal Vinit to the first pole of the drive transistor under the control of the reset control signal RE to control the reset of the corresponding display element, thereby avoiding the influence of the voltage loaded on the display element during the light emission of the previous frame on the light emission of the next frame and further reducing the after-image phenomenon.

For example, the silicon-based organic light emitting display panel further includes a plurality of pixel units PX located in the display region A, each pixel unit PX includes a plurality of sub pixels. Each sub pixel includes one display element L and one pixel circuit 110. Further, the pixel unit PX includes 3 sub pixels of different colors. The three sub pixels for example are respectively a red sub pixel, a green sub pixel and a blue sub pixel. Of course, the pixel unit PX may include 4, 5 or more sub pixels, which need to be designed and determined according to the actual application requirements, and are not limited here.

For example, the pixel circuits 110 in at least two adjacent sub pixels in the same row share one voltage control circuit 120. For example, as illustrated in FIG. 7, all pixel circuits 110 in the same row share one voltage control circuit 120. Alternatively, the pixel circuits 110 in two, three or more adjacent sub pixels in the same row share one voltage control circuit 120, which is not limited here. In this way, by sharing the voltage control circuit 120, the occupied area of the pixel circuit in the display region A is reduced.

For example, the two electrodes of the light emitting element L are respectively the first electrode 610 and the second electrode 630. For example, the first electrode 610 is the anode of the light emitting element L, and the second electrode 630 is the cathode of the light emitting element L. The first electrode 610 is connected to the pixel circuit 110, and the second electrode 630 is input with the first power signal VSS. The first power signal VSS is transmitted to the second electrode 630 through the connection electrode 141.

The display panel provided by the embodiments of the present disclosure for example is a small-sized light emitting diode display panel, i.e., a micro light emitting diode display panel. The display panel may be applied to any product or component with a display function such as a television, a digital camera, a mobile phone, a watch, a tablet computer, a notebook computer, a navigator and the like, and is particularly suitable to be applied to a helmet-mounted display, a stereoscopic display mirror, a spectacle display and the like. The above display panel may be connected with mobile communication network, satellite positioning system and other systems to obtain accurate image information at any place and at any time. In addition, the display panel provided by the embodiments of the present disclosure may be applied to a virtual reality device or an augmented reality device.

The embodiments of the present disclosure provides a light emitting diode display device including the display substrate or the display panel provided in any of the above embodiments. The display device may include any product or component with a display function such as a television, a digital camera, a mobile phone, a watch, a tablet computer, a notebook computer, a navigator, etc. The display device has the same technical effects as the display substrate provided in the above embodiments.

The embodiments of the present disclosure provide a manufacturing method of a color film structure. FIG. 8A is a flowchart of the manufacturing method of the color film structure. As illustrated in FIG. 8A, the manufacturing method includes S11-S12.

S11. Forming a first color film 200 on a bottom layer 100. The bottom layer 100 includes a display region A and a peripheral region B surrounding the display region, and the first color film 200 includes only a first pixel color film 210 located in the display region.

FIG. 8B is a schematic structural diagram of the first color film 200. The color film structure after S11 is completed is illustrated in FIG. 8B.

For example, the method of forming the first color film 200 on the bottom layer 100 includes coating the first color film material layer on the bottom layer using a spin coating method, and performing a patterning process on the first color film material layer to form the first color film 200.

For example, depending on the color of the first color film material layer, the coating speed is appropriately adjusted.

For example, after the first color film material layer is pre-baked, exposed, developed, and post-baked, the first pixel color film 210 is formed on the display region A.

For example, depending on the color of the first color film material layers, the exposure intensity and development time are appropriately adjusted.

S12. Forming a second color film 300 on the first color film. The second color film includes a second pixel color film 310 located in the display region and at least partially non-overlapping with the first pixel color film, and a first frame color film 320 located in the peripheral region and surrounding the display region.

The method of forming the second color film 300 on the first color film is the same as the above method of forming the first color film 200 on the bottom layer 100, and will not be repeated here.

The color film structure after Si 1 and S12 are completed includes the first color film 200 and the second color film 300, as illustrated in FIG. 2A.

FIG. 9 is another flowchart of the manufacturing method of the color film structure. As illustrated in FIG. 9, the manufacturing method includes not only S11 and S12, but also:

S13a: after forming the second color film 300, forming a third color film 400 on the first color film. The third color film 400 includes a third pixel color film 410 located in the display region and at least partially non-overlapping with the first pixel color film and the second pixel color film, and a second frame color film 420 located in the peripheral region and surrounding the display region. The second frame color film 420 is located on the side of the first frame color film 320 away from the bottom layer.

The method of forming the third color film 400 on the first color film is the same as the above-mentioned method of forming the first color film 200 on the bottom layer 100, and will not be repeated here.

The color film structure after S11, S12, and S13a are completed includes the first color film 200, the second color film 300, and the third color film 400, as illustrated in FIG. 3.

Figure 10:
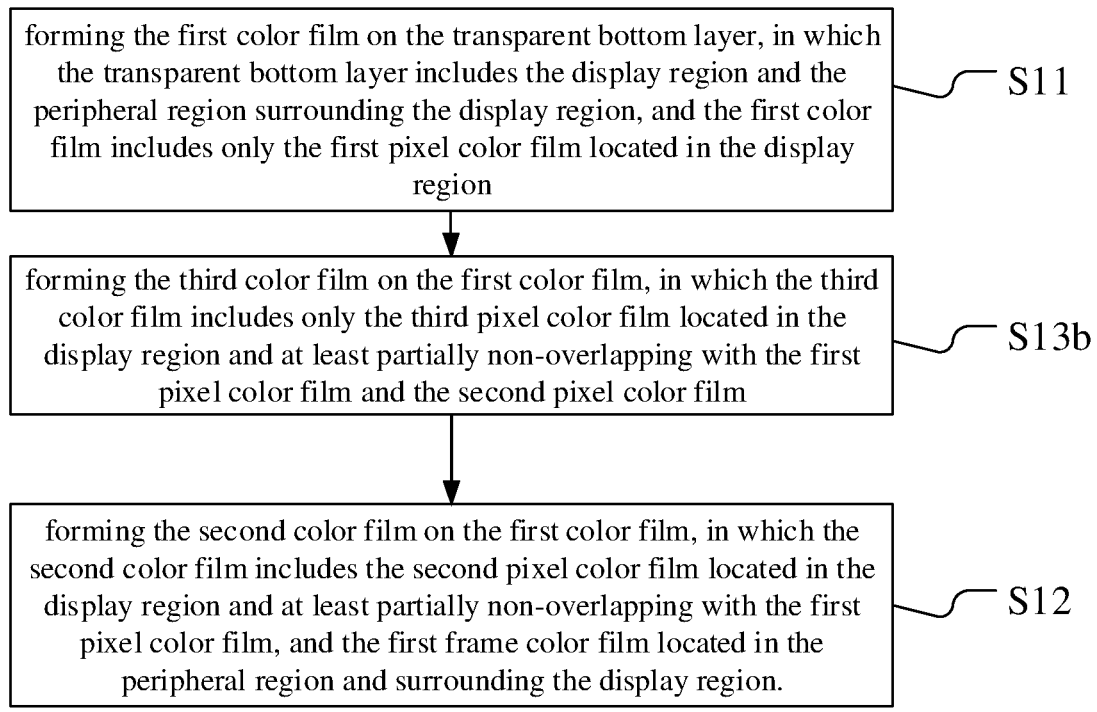
FIG. 10 is another flowchart of the manufacturing method of the color film structure according to the embodiments of the present disclosure.

FIG. 10 is another flowchart of the manufacturing method of the color film structure. As illustrated in FIG. 10, the manufacturing method includes not only S11 and S12, but also:

S13b: after forming the first color film 200 and before forming the second color film 300, forming a third color film 400 on the first color film, and the color film 400 includes only the third pixel color film 410 located in the display region and at least partially non-overlapping with the first pixel color film.

The method of forming the third color film 400 on the first color film is the same as the above method of forming the first color film 200 on the bottom layer 100, and will not be repeated here.

The color film structure after S11, S13b, and S12 are completed includes the first color film 200, the second color film 300, and the third color film 400, as illustrated in FIG. 4.

In some examples, in the color film structure manufactured by the above method, the first pixel color film is at least partially overlapped with the second pixel color film or the third pixel color film; and in the overlapped portion of the first pixel color film with the second pixel color film or the third pixel color film, the first pixel color film is located on the side of the second pixel color film or the third pixel color film close to the bottom layer.

The embodiments of the present disclosure further provide a manufacturing method of a display substrate, which includes:

Providing a base substrate, including a display region and a peripheral region surrounding the display region; forming a light emitting element in the display region of the base substrate; and manufacturing a color film structure on the light emitting element.

The manufacturing method of the color film structure includes the manufacturing method of the color film structure provided in any of the above embodiments, and will not be described here.

The embodiments of the present disclosure further provide a mask plate group, the mask plate group is configured to manufacture the color film structure provided in the above embodiments, and the mask plate group includes a first mask plate 20 and a second mask plate 30.

Figure 11:
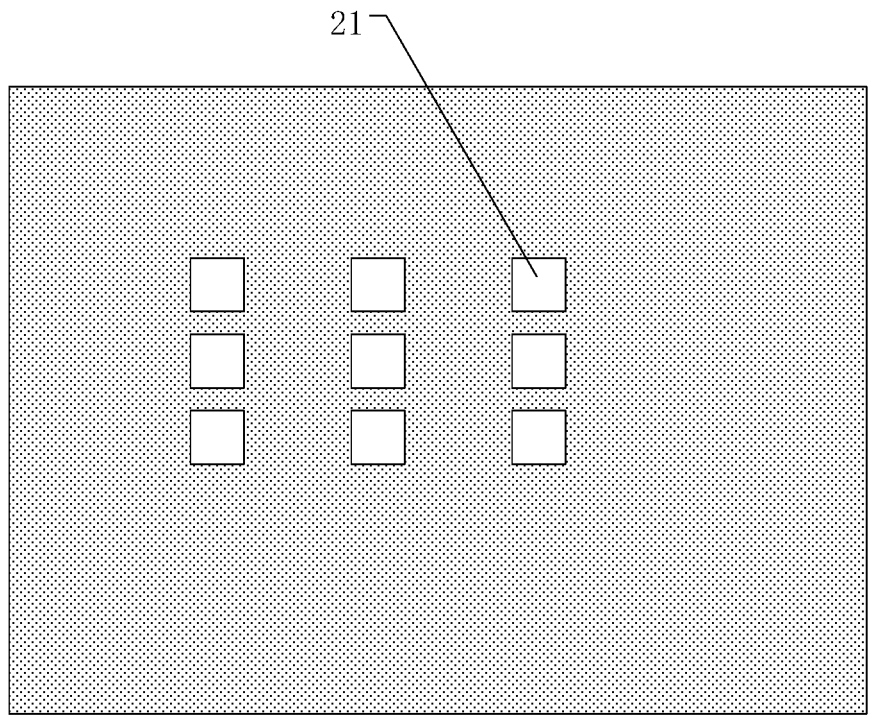
FIG. 11 is a schematic structural diagram of a first mask plate according to the embodiments of the present disclosure.

FIG. 11 is a schematic structural diagram of the first mask plate 20. As illustrated in FIG. 11, the pattern region of the first mask plate 20 includes only the first pixel pattern 21 located in the middle portion of the first mask plate 20. The first pixel pattern 21 is configured to form the first pixel color film 210 of the first color film 200 as illustrated in FIG. 2A and/or form the third pixel color film 410 of the third color film 400 as illustrated in FIG. 4. For example, a plurality of the first pixel patterns 21 are provided.

For example, the first mask plate is used in step S11 and step S13b in the manufacturing method of the color film structure provided in the above embodiments. That is, in step S11, the color film material layer of the first color film 200 is patterned using the first mask plate; and in step S13b, the color film material layer of the third color film 400 is patterned using the first mask plate. It should be noted that during the third color film 400 is made using the first mask plate in S13*b*, the position of the first mask plate is different from the position of the first mask plate during the first color film 200 is made using the first mask plate in S11. For example, during manufacturing the color film structure illustrated in FIG. 4, the position of the first mask plate in manufacturing the third color film 400 using the first mask plate is shifted to the right by a distance of 2 sub pixel color films relative to the position of the first mask plate in manufacturing the first color film 200 using the first mask plate.

Figure 12:
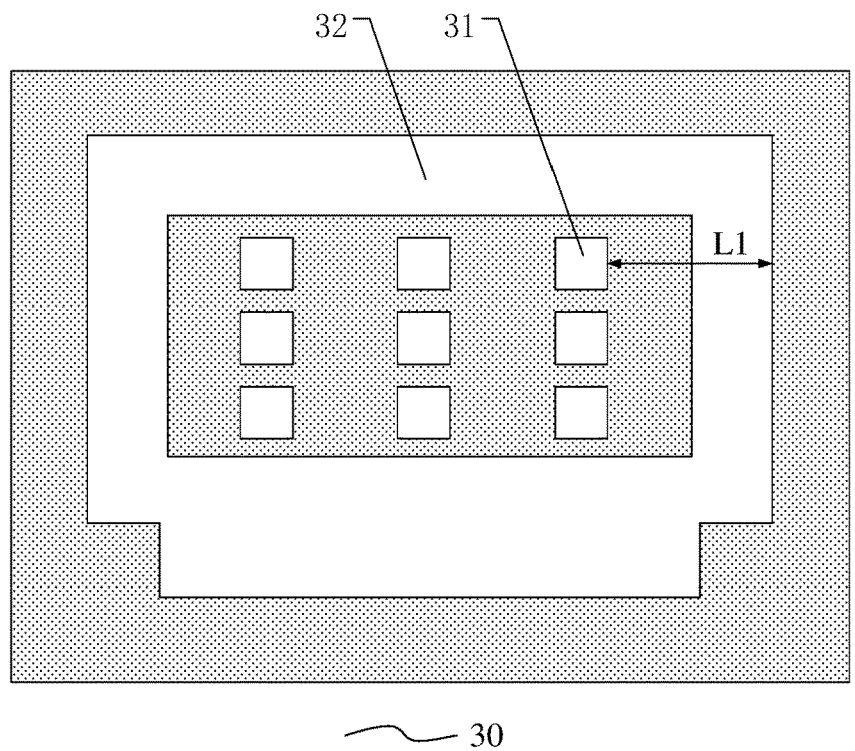
FIG. 12 is a schematic structural diagram of a second mask plate according to the embodiments of the present disclosure.

FIG. 12 is a schematic structural diagram of the second mask plate 30. As illustrated in FIG. 12, the pattern region of the second mask plate 30 includes a second pixel pattern 31 located in the middle portion of the mask plate 30 and a first frame pattern 32 surrounding the middle portion. The second pixel pattern 31 is configured to form the second pixel color film 310 of the second color film 300 as illustrated in FIG. 2A, and the first frame pattern 32 is configured to form the first frame color film 320 as illustrated in FIG. 2A. For example, a plurality of the second pixel patterns 31 are provided.

For example, the first frame pattern 32 is a closed annular shape, and the present disclosure is not limited to its specific shape.

The second mask plate is used in step S12 of the manufacturing method of the color film structure provided in the above embodiments. That is, in step S12, the color film material layer of the second color film 300 is patterned using the second mask plate.

By using the mask plate group comprising the first mask plate and the second mask plate, the color film structure illustrated in FIG. 2A is manufactured according to the steps illustrated in FIG. 8A. In addition, by using the first mask plate twice and the second mask plate once, the color film structure illustrated in FIG. 4 is manufactured according to the steps illustrated in FIG. 10. The manufactured color film structure is the same as the color film structure provided in the above embodiments, thus having the same technical effect.

In some examples, the mask plate group further includes a third mask plate 40.

Figure 13:
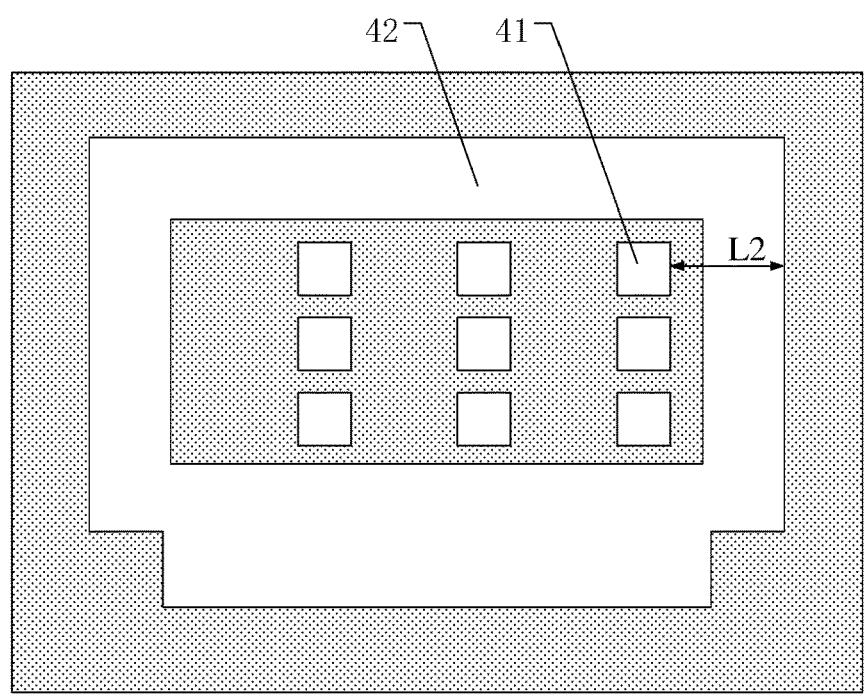
FIG. 13 is a schematic structural diagram of a third mask plate according to the embodiments of the present disclosure.

FIG. 13 is a schematic structural diagram of the third mask plate 40. As illustrated in FIG. 13, the pattern region of the third mask plate 40 includes a third pixel pattern 41 located in the middle portion of the third mask plate 40 and a second frame pattern 42 surrounding the middle portion. For example, a plurality of the third pixel patterns 41 are provided. The third pixel pattern 41 is configured to form the third pixel color film 410 of the third color film 400 as illustrated in FIG. 3, and the second frame pattern 42 is configured to form the second frame color film 420 as illustrated in FIG. 3. The shape and size of the first frame pattern 32 are approximately same as the shape and size of the second frame pattern 42, except that the distance between at least one side of the first frame pattern 32 and the second pixel pattern 31 is different from the distance between the corresponding side of the second frame pattern 42 and the third pixel pattern 41, so that the second pixel color film and the third pixel color film at least partially do not overlap with each other. For example, as illustrated in FIGS. 13 and 12, the distance L1 between the right side of the first frame pattern 32 and the second pixel pattern 31 closest to the right side of the first frame pattern 32 is different from the distance L2 between the right side of the second frame pattern 42 and the third pixel pattern 41 closest to the right side of the second frame pattern 42.

In some examples, the second frame pattern 42 is a closed annular shape, and the present disclosure is not limited to its specific shape.

The third mask plate is used in step S13*a* of the manufacturing method of the color film structure provided in the above embodiments. That is, in step S13*a*, the color film material layer of the third pixel color film 410 and the second frame color film 420 of the third color film 400 is patterned by using the third mask plate.

Using the mask plate group comprising the first mask plate, the second mask plate and the third mask plate, the color film structure illustrated in FIG. 3 is manufactured according to the steps illustrated in FIG. 9. The manufactured color film structure is the same as the color film structure provided in the above embodiments, thus having the same technical effects.

The following statements should be noted:

(1) The accompanying drawings involve only the structure(s) in connection with the embodiment(s) of the present disclosure, and other structure(s) may be referred to common design(s).

(2) In case of no conflict, features in one embodiment or in different embodiments may be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

The invention claimed is:

1. A display substrate, comprising:
    a base substrate, comprising a display region and a peripheral region surrounding the display region;
    a first light emitting element in the display region; and
    a color film structure on a display side of the first light emitting element, wherein the color film structure comprises:
    a first color film, comprising only a first pixel color film located in the display region; and
    a second color film, comprising: a second pixel color film located in the display region and at least partially non-overlapping with the first pixel color film, and a first frame color film located in the peripheral region and surrounding the display region, wherein the first frame color film has an annular shape surrounding the display region.

2. The display substrate according to claim 1, wherein the color film structure further comprises:
    a third color film, comprising: a third pixel color film located in the display region and at least partially non-overlapping with the first pixel color film and the second pixel color film, and a second frame color film located in the peripheral region and surrounding the display region, wherein the second frame color film is on a side of the first frame color film away from the base substrate.

3. The display substrate according to claim 2, wherein an orthographic projection of the second frame color film on the base substrate completely coincides with or falls within an orthographic projection of the first frame color film on the base substrate.

4. The display substrate according to claim 2, wherein a sum of a thickness of the first frame color film and a thickness of the second frame color film is greater than a thickness of the first pixel color film by 2 to 3 µm.

5. The display substrate according to claim 1, further comprising:
a third color film, comprising only a third pixel color film located in the display region and at least partially non-overlapping with the first pixel color film and the second pixel color film.

6. The display substrate according to claim 2, wherein the first pixel color film is at least partially overlapped with the second pixel color film or the third pixel color film, and
in an overlapped portion of the first pixel color film with the second pixel color film or the third pixel color film, the first pixel color film is on a side of the second pixel color film or the third pixel color film close to the base substrate.

7. The display substrate according to claim 2, wherein the first color film, the second color film, and the third color film are color films of different colors.

8. The display substrate according to claim 7, wherein the first color film, the second color film, and the third color film are respectively a red color film, a blue color film, and a green color film.

9. The display substrate according to claim 1, further comprising a sensing region in the peripheral region, wherein
the sensing region comprises a plurality of sensing pixel units, each of the plurality of sensing pixel units comprises a second light emitting element and a sensing circuit, and
the color film structure is on a side of the second light emitting element and the sensing circuit away from the base substrate, and an orthographic projection of the sensing region on the base substrate is within an orthographic projection of the first frame color film on the base substrate.

10. The display substrate according to claim 1, further comprising a connection electrode region in the peripheral region, wherein
the connection electrode region is an annular region surrounding the display region and comprises a plurality of connection electrodes, and
the color film structure is on a side of the plurality of connection electrodes away from the base substrate, and an orthographic projection of the connection electrode region on the base substrate is within an orthographic projection of the first frame color film on the base substrate.

11. The display substrate according to claim 10, further comprising a first dummy region in the peripheral region, wherein
the first dummy region is located between the connection electrode region and the display region and comprises a plurality of first dummy electrodes, and
the color film structure is on a side of the plurality of first dummy electrodes away from the base substrate, and an orthographic projection of the first dummy region on the base substrate is within the orthographic projection of the first frame color film on the base substrate.

12. The display substrate according to claim 11, further comprising a second dummy region in the peripheral region, wherein the second dummy region is located on the outermost periphery of the peripheral region to surround the first dummy region and the connection electrode region, and the second dummy region comprises a plurality of second dummy electrodes, and
the color film structure is on a side of the plurality of second dummy electrodes away from the base substrate, and an orthographic projection of the second dummy region on the base substrate is within the orthographic projection of the first frame color film on the base substrate.

13. The display substrate according to claim 1, wherein the base substrate is a silicon substrate.

14. The display substrate according to claim 13, wherein a side of the silicon substrate facing the first light emitting element comprises a pixel circuit structure, and the pixel circuit structure is connected to the first light emitting element, and at least a part of the pixel circuit structure is in the silicon substrate.

15. The display substrate according to claim 1, further comprising a thin film encapsulation layer, wherein the thin film encapsulation layer is on a side of the first color film facing the base substrate.

16. A display device, comprising the display substrate according to claim 1.

17. A manufacturing method of a display substrate, comprising:
providing a base substrate, comprising a display region and a peripheral region surrounding the display region;
forming a first light emitting element in the display region;
forming a first color film on the first light emitting element, the first color film comprising only a first pixel color film in the display region; and
forming a second color film, wherein the second color film comprises: a second pixel color film in the display region and at least partially non-overlapping with the first pixel color film, and a first frame color film in the peripheral region and surrounding the display region, wherein the first frame color film has an annular shape surrounding the display region.

18. The manufacturing method according to claim 17, further comprising:
after forming the second color film, forming a third color film,
wherein the third color film comprises: a third pixel color film located in the display region and at least partially non-overlapping with the first pixel color film and the second pixel color film, and a second frame color film located in the peripheral region and surrounding the display region, wherein the second frame color film is on a side of the first frame color film away from the base substrate.

19. The manufacturing method according to claim 17, further comprising:
after forming the first color film and before forming the second color film, forming a third color film, wherein the third color film comprises only a third pixel color film located in the display region and at least partially non-overlapping with the first pixel color film and the second pixel color film.

* * * * *